(12) United States Patent
Jung

(10) Patent No.: US 10,013,376 B2
(45) Date of Patent: Jul. 3, 2018

(54) SYSTEM INCLUDING INTERFACE CIRCUIT FOR DRIVING DATA TRANSMISSION LINE TO TERMINATION VOLTAGE

(71) Applicant: SK hynix Inc., Icheon-si, Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 258 days.

(21) Appl. No.: 14/805,760

(22) Filed: Jul. 22, 2015

(65) Prior Publication Data

US 2016/0253279 A1  Sep. 1, 2016

(30) Foreign Application Priority Data

Feb. 27, 2015 (KR) .................. 10-2015-0028322

(51) Int. Cl.
| | |
|---|---|
| *G06F 13/00* | (2006.01) |
| *G06F 13/38* | (2006.01) |
| *G06F 13/364* | (2006.01) |
| *G06F 13/42* | (2006.01) |
| *G11C 8/18* | (2006.01) |

(52) U.S. Cl.
CPC ........ *G06F 13/364* (2013.01); *G06F 13/4282* (2013.01); *G11C 8/18* (2013.01)

(58) Field of Classification Search
None
See application file for complete search history.

(56) References Cited

U.S. PATENT DOCUMENTS

| | | | |
|---|---|---|---|
| 7,800,399 B1 * | 9/2010 | Schumann ......... | H03K 19/0005 326/27 |
| 2011/0199843 A1 * | 8/2011 | Dreps .................. | G11C 7/1051 365/193 |
| 2014/0016401 A1 | 1/2014 | Komyo et al. | |
| 2015/0186328 A1 * | 7/2015 | Bonen .................. | G11C 29/028 710/105 |

* cited by examiner

*Primary Examiner* — David E Martinez
(74) *Attorney, Agent, or Firm* — William Park & Associates Ltd.

(57) ABSTRACT

A system includes a data transmission unit, a termination resistor and a data reception unit. The data transmission unit may drive a data transmission line based on data, and drive the data transmission line to a voltage level corresponding to a termination voltage during a specified operation period. The termination resistor may be coupled between the data transmission line and a termination node. The data reception unit may receive a signal transmitted through the data transmission line.

5 Claims, 3 Drawing Sheets

SYSTEM INCLUDING INTERFACE CIRCUIT FOR DRIVING DATA TRANSMISSION LINE TO TERMINATION VOLTAGE

CROSS-REFERENCES TO RELATED APPLICATION

The present application claims priority under 35 U.S.C. § 119(a) to Korean application number 10-2015-0028322 filed on Feb. 27, 2015, in the Korean Intellectual Property Office, which is incorporated herein by reference in its entirety.

BACKGROUND

1. Technical Field

Various embodiments generally relate to an integrated circuit, and more particularly to an interface circuit for high speed communication and a system including the same.

2. Related Art

Recent developments in electronic systems such as a personal computer, a tablet PC, a laptop computer and a smart phone are leading to high-speed signal transmission between various electronic components therein. High-speed signal transmission between two different electronic components can be obtained by improved interface circuits.

Manufacturers of electronic systems are under continuous pressure to increase performance and reduce power consumption. To improve the performance of the electronic system, interface circuits may increase bandwidth. To reduce the power consumption of the electronic system, swing widths of signals to be transmitted through signal transmission lines may be reduced. Therefore, in order to ensure precise transmission of signals, impedance matching of electronic components for transmitting and receiving signals is important.

SUMMARY

In an embodiment, a system may include a data transmission unit configured to drive a data transmission line based on data, and drive the data transmission line to a voltage level corresponding to a termination voltage during a specified operation period, a termination resistor coupled between the data transmission line and a termination node, and a data reception unit configured to receive a signal transmitted through the data transmission line.

In an embodiment, a system with interface circuits may include a data transmission unit configured to drive a data transmission line in response to a pull-up signal and a pull-down signal which are enabled based on data, a data strobe transmission unit configured to transmit a data strobe signal synchronized with the data after a preamble, to a data strobe signal transmission line, and a termination voltage control unit configured to enable both the pull-up signal and the pull-down signal in response to a preamble control signal.

In an embodiment, a system may include a plurality of data transmission lines configured to transmit data signals, a plurality of data strobe signal transmission lines configured to transmit data strobe signals, and an interface circuit configured to generate a preamble in the data strobe signals, the preamble being transmitted through the data strobe signal transmission lines during a period prior to a transmission of the data strobe signals to drive the plurality of the data transmission lines to a termination voltage level.

DETAILED DESCRIPTION

Figure 1:
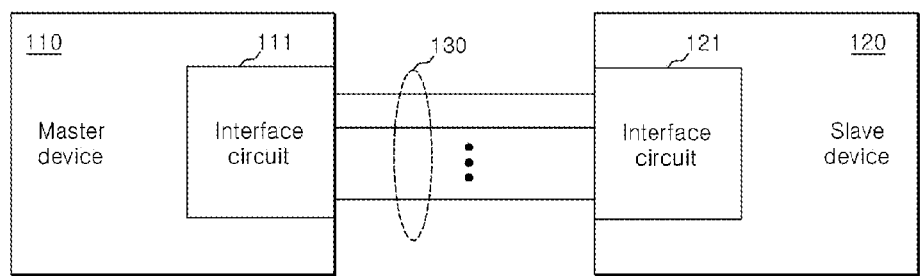
FIG. 1 is a diagram illustrating an example configuration of a system in accordance with an embodiment.

FIG. 1 is a diagram illustrating an example configuration of a system in accordance with an embodiment. A system 1 may include a master device 110 and a slave device 120 therein. Examples of the system 1 may include, but are not limited to, workstations, laptops, client-side terminals, servers, distributed computing systems, handheld devices and video game consoles. The master device 110 and the slave device 120 may be linked to each other.

The master device 110 may control various operations carried out by the slave device 120. The master device 110 may also execute an operation system and perform various calculation functions in an electronic device. For instance, the master device 110 may include a processor. Examples of the processor may include, but are not limited to, a central processing unit ("CPU"), a graphic processing unit ("GPU"), a multimedia processor ("MMP") or a digital signal processor ("DSP"). The master device 110 may be realized in the form of a system-on-chip ("SoC") by combining processor chips having various functions, such as application processors.

Under control of the master device 110, the slave device 120 may perform various operations. Examples of the slave device 120 may include, but are not limited to, all the components that operate under control of the master device 110. Examples of the slave device 120 may include, but are not limited to, a system memory, a power controller, or a module such as a communication module, a multimedia module and an input/output module capable of performing various functions. For instance, the slave device 120 may be a memory device. The memory device may include therein one or more of volatile memory devices such as a static random access memories ("SRAM"), a dynamic random access memories ("DRAM"), and a synchronous DRAM ("SDRAM") and nonvolatile memory devices such as a read only memory ("ROM"), a programmable ROM ("PROM"), an electrically erasable and programmable ROM ("EEPROM"), an electrically programmable ROM ("EPROM"), a flash memory, a phase change RAM ("PRAM"), a magnetic RAM ("MRAM"), a resistive RAM ("RRAM"), and a ferroelectric RAM ("FRAM").

The master device 110 may be linked to the slave device 120 through a plurality of buses 130. The master device 110 may transmit/receive signals to/from the slave device 120 through the plurality of buses 130. For instance, the plurality of buses 130 may include, but not limited to, signal transmission lines such as data buses, command buses, address buses, and clock buses.

The master device 110 and the slave device 120 may include interface circuits 111 and 121 that transmit or receive signals to or from each other. The interface circuit 111 of the master device 110 may, through the buses 130, transmit signals to the slave device 120 and receive the signals transmitted from the slave device 120. The interface circuit 111 may convert the signals generated in the master device 110 into signals appropriate to be transmitted through the buses 130 or convert the signals received through the buses 130 into signals appropriate to be used in the master device 110. The interface circuit 121 of the slave device 120 may, through the buses 130, receive signals from the master device 110 and transmit signals to the master device 110. The interface circuit 121 may convert the signals received through the buses 130 into signals appropriate to be used in the slave device 120 or convert the signals generated in the slave device 120 into signals appropriate to be transmitted through the buses 130. For instance, the master device 110 and the slave device 120 may use a serial communication scheme, and the interface circuits 111 and 121 may include components such as encoding units, decoding units, serialization units and parallelization units.

Because of impedance differences at the nodes where the master device 110 and the slave device 120 are connected to the plurality of buses 130, impedance matching is needed for reliable communication between the master device 110 and the slave device 120. As the operation speed of a system increases and the power consumption of the system decreases, the swing widths or amplitudes of signals to be transmitted through the buses 130 are gradually decreasing. Therefore, impedance matching is necessary, and it can be achieved by matching the impedance of the interface circuit coupled to one end of the buses 130 and the impedance of the interface circuit coupled to the other end of the buses 130. The interface circuits 111 and 121 may include termination circuits for such impedance matching. Each termination circuit may adjust the impedance of a device for receiving the signals transmitted through the buses 130, such that a device receiving signals may have substantially the same impedance as the impedance of a device for transmitting the signals.

Figure 2:
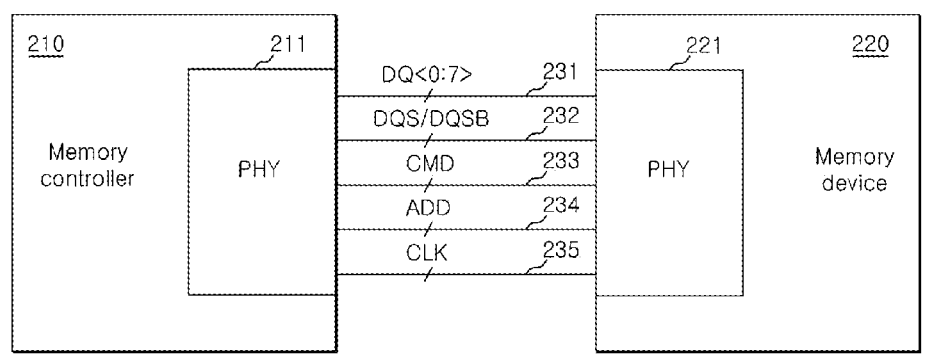
FIG. 2 is a diagram illustrating an example configuration of a system in accordance with an embodiment.

FIG. 2 is a diagram illustrating an example configuration of a system 2 in accordance with an embodiment. The system 2 may include a memory controller 210 and a memory device 220. The memory controller 210 may be applied as the master device 110 of FIG. 1, and the memory device 220 may be applied as the slave device 120 of FIG. 1. The memory controller 210 and the memory device 220 may be coupled to one another through a plurality of buses. The plurality of buses may include a data bus 231 and a data strobe bus 232. The data bus 231 may include a plurality of data transmission lines. The plurality of data transmission lines may transmit data DQ<0:7> from the memory controller 210 to the memory device 220, or may transmit data DQ<0:7> from the memory device 220 to the memory controller 210. The data strobe bus 232 may transmit a data strobe signal DQS from the memory controller 210 to the memory device 220. Also, the data strobe bus 232 may transmit a data strobe signal DQS from the memory device 220 to the memory controller 210. The data strobe signal DQS may be used as a signal for notifying timing at which the data DQ<0:7> are transmitted through the data bus 231. For example, when the system 2 performs a write operation, the memory controller 210 may transmit the data strobe signal DQS through the data strobe bus 232 in synchronization with timing at which the data DQ<0:7> are transmitted through the data bus 231. The data strobe bus 232 may include a plurality of data strobe transmission lines. The plurality of data strobe transmission lines may transmit the data strobe signal DQS and its complementary signal DQSB.

The plurality of buses may further include a command bus 233, an address bus 234, and a clock bus 235. The command bus 233, the address bus 234 and the clock bus 235 may transmit signals for the memory controller 210 to control the memory device 220. For example, the command bus 233 may transmit a command signal CMD so that the memory device 220 may perform various operations. The address bus 234 may transmit an address signal ADD indicating where, in a memory array of the memory device 220, the data DQ<0:7> are to be written. The clock bus 235 may transmit a clock signal CLK. Examples of the clock signal CLK may include, but are not limited to, a differential clock signal, a multi-phase clock signal, and a plurality of clock signals with different frequencies.

The memory controller 210 may include an interface circuit 211 for transmitting the data DQ<0:7>, the data strobe signals DQS and DQSB, the command signal CMD, the address signal ADD, and the clock signal CLK. The memory device 220 may include an interface circuit 221 for receiving, from the memory controller 210, the data DQ<0:7>, the data strobe signals DQS and DQSB, the command signal CMD, the address signal ADD, and the clock signal CLK. The interface circuits 211 and 221 may be physical layers PHY. The interface circuits 211 and 221 may include signal transmission units for driving the plurality of buses to transmit signals, and signal reception units for receiving the signals transmitted through the plurality of buses.

Figure 3:
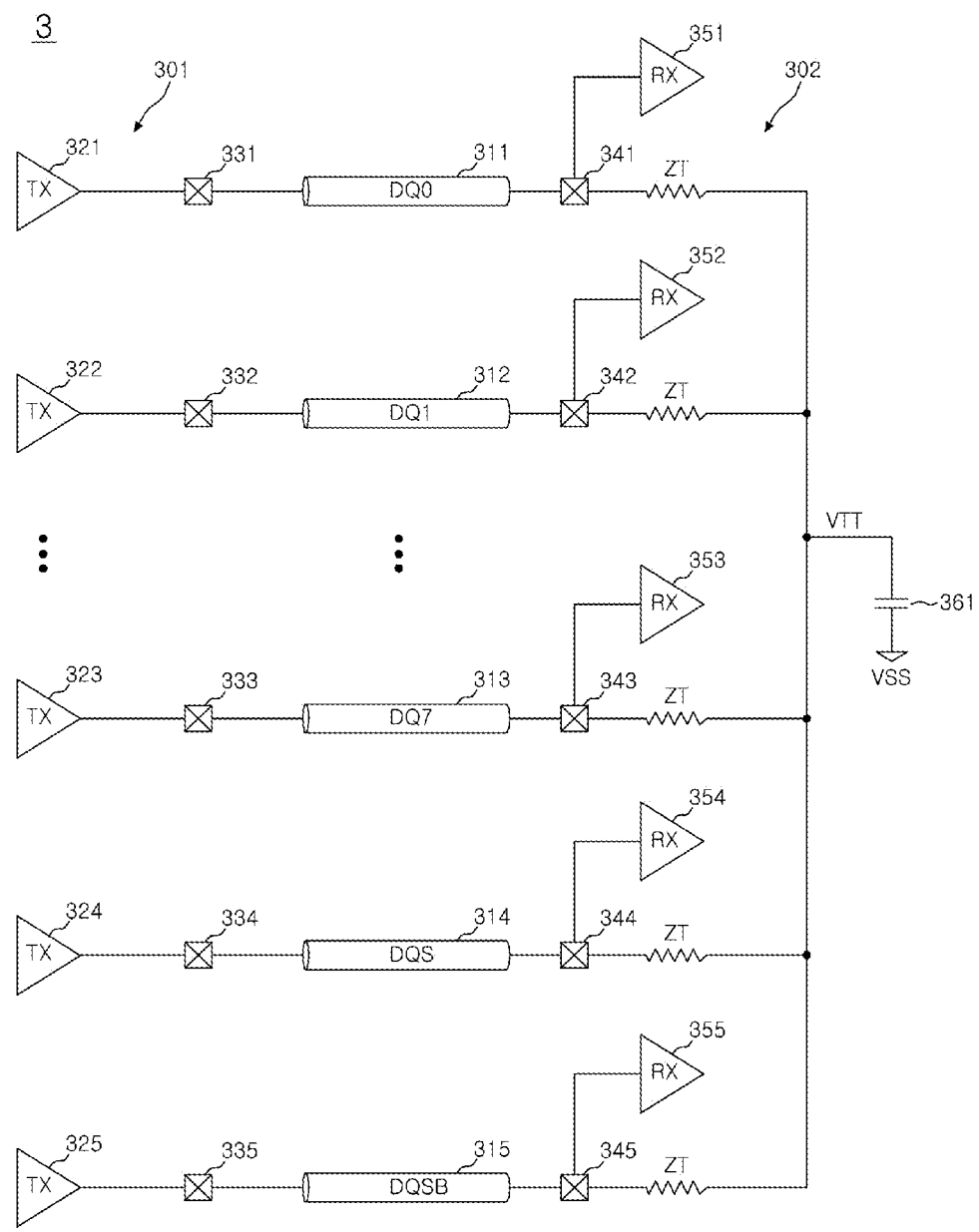
FIG. 3 is a diagram illustrating an example configuration of a system in accordance with an embodiment.

FIG. 3 is a diagram illustrating an example configuration of a system 3 in accordance with an embodiment. A first interface circuit 301 may be an interface circuit of a memory controller, and a second interface circuit 302 may be an interface circuit of a memory device. The first interface circuit 301 may be coupled to the second interface circuit 302 through signal transmission lines 311 to 315. The first interface circuit 301 may include a plurality of signal transmission units TX. The plurality of signal transmission units TX may include a plurality of data transmission units 321 to 323 and a plurality of data strobe transmission units 324 and 325. The plurality of data transmission units 321 to 323 may be respectively coupled to a plurality of data transmission lines 311 to 313 through data transmission pads 331 to 333. The plurality of data transmission units 321 to 323 may drive the data transmission lines 311 to 313 according to the level of data to transmit. For example, in the case where the level of data to transmit is a logic high, the data transmission units 321 to 323 may drive the data transmission lines 311 to 313 to a high level, and, in the case where the level of data to transmit is a logic low, the data transmission units 321 to 323 may drive the data transmission lines 311 to 313 to a low level. If the data transmission lines 311 to 313 are driven by the data transmission units 321 to 323, first to eighth data DQ0 to DQ7 may be transmitted through the data transmission lines 311 to 313. The plurality of data strobe transmission units 324 and 325 may be respectively coupled to a plurality of data strobe signal transmission lines 314 and 315 through data strobe transmission pads 334 and 335. The plurality of data strobe transmission units 324 and 325 may transmit a data strobe signal DQS and a complementary signal DQSB thereof through the plurality of data strobe signal transmission lines 314 and 315.

The second interface circuit 302 may include a plurality of reception pads 341 to 345 which are respectively coupled to the signal transmission lines 311 to 315. The respective data transmission lines 311 to 313 may be coupled to termination resistors ZT through the data reception pads 341 to 343. The termination resistors ZT may be coupled between the data transmission lines 311 to 313 and a termination node VTT. Also, the second interface circuit 302 may include a plurality of signal reception units RX. The plurality of signal reception units RX may include a plurality of data reception units 351 to 353 and a plurality of data strobe reception units 354 and 355. The plurality of data reception units 351 to 353 may be coupled to the data transmission lines 311 to 313 through the data reception pads 341 to 343 to receive the data DQ0 to DQ7 transmitted through the data transmission lines 311 to 313.

The termination resistors ZT may be provided for impedance matching between the first interface circuit 301 and the second interface circuit 302. The termination resistors ZT may have substantially the same impedance values as the turn-on impedance values of the data transmission units 321 to 323. The termination node VTT may be set to a termination voltage level. The impedance matching may be completed when the data reception pads 341 to 343 are coupled to the termination resistors ZT and the termination node VTT is set to the termination voltage level. The second interface circuit 302 may further include a capacitor element 361 which is coupled to the termination node VTT. The capacitor element 361 may stabilize the voltage level of the termination node VTT. The capacitor element 361 may prevent the voltage level of the termination node VTT from fluctuating due to a voltage variation, a temperature variation or other noise.

The second interface circuit 302 may include a plurality of data strobe reception pads 344 and 345. The plurality of data strobe reception pads 344 and 345 may be respectively coupled to the plurality of data strobe signal transmission lines 314 and 315. The plurality of data strobe signal transmission lines 314 and 315 may be respectively coupled to termination resistors ZT through the plurality of data strobe reception pads 344 and 345. The termination resistors ZT may be coupled to the termination node VTT. Also, the data strobe signal transmission lines 314 and 315 may be coupled to the plurality of data strobe reception units 354 and 355 through the data strobe reception pads 344 and 345. The plurality of data strobe reception units 354 and 355 may receive the data strobe signal DQS and the complementary signal DQSB thereof transmitted through the plurality of data strobe signal transmission lines 314 and 315.

Figure 4:
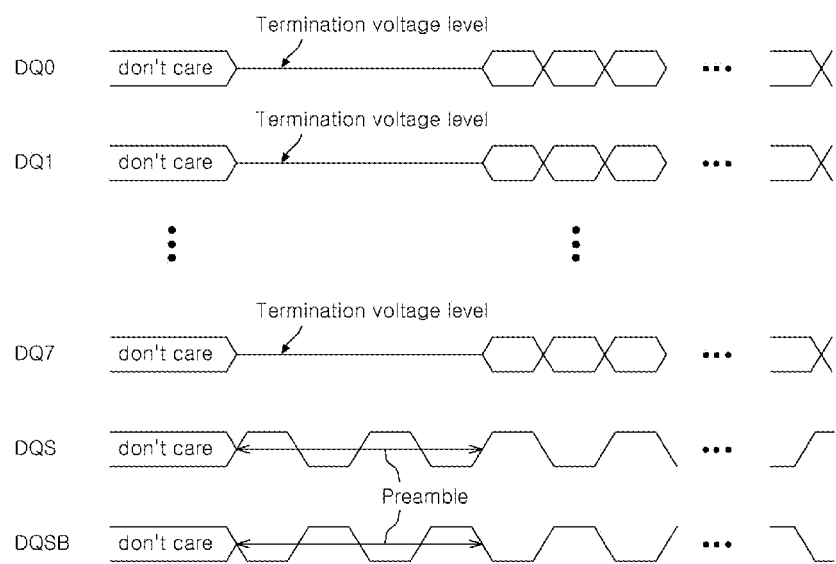
FIG. 4 is a timing diagram for explaining operations of the systems shown in FIGS. 2 and 3.

FIG. 4 is a timing diagram for explaining operations of the systems 2 and 3 shown in FIGS. 2 and 3. A memory device may perform various operations such as read/write operations, and a precharge operation. Referring to FIGS. 2 and 3, the memory controller 210 may control the operations of the memory device 220 by transmitting the command signal CMD through the command bus 233, and by transmitting/receiving the data DQ<0:7> through the data transmission lines 311 to 313, and the data strobe signals DQS and DQSB through the data strobe signal transmission lines 314 and 315. For example, the memory controller 210 may transmit an active command signal through the command bus 233 to prepare read/write operations in the memory device 220. While the memory device 220 is preparing read/write operations, the data transmission lines 311 to 313 and the data strobe signal transmission lines 314 and 315 may be in a period in which signals are not transmitted therethrough (e.g., "don't care" period shown in FIG. 4). If the memory controller 210 transmits a write command signal through the command bus 233, the memory device 220 may perform a write operation. The memory controller 210 may transmit, through the data transmission lines 311 to 313, the data DQ<0:7> to the memory device 220, and may also transmit the data strobe signals DQS and DQSB through the data strobe signal transmission lines 314 and 315 to notify timing at which the data DQ<0:7> are transmitted. To improve synchronization in transmission timing of the data DQ<0:7> and the data strobe signals DQS and DQSB, the data strobe signals DQS and DQSB may have preambles. While the preambles are being transmitted through the data strobe signal transmission lines 314 and 315, no data are transmitted through the data transmission lines 311 to 313.

The system 3 in accordance with an embodiment may drive the data transmission lines 311 to 313 to the termination voltage level during a specified operation period. The specified operation period may be a period in which the preambles of the data strobe signals DQS and DQSB are transmitted. That is to say, the first interface circuit 301 may maintain the data transmission lines 311 to 313 at the termination voltage level during the period in which the preambles of the data strobe signals DQS and DQSB are transmitted. If the data transmission lines 311 to 313 are driven to the termination voltage level, the termination node VTT coupled to the termination resistors ZT may be set to the termination voltage level. Therefore, even if a voltage generated by a separate voltage generator is not applied, the termination node VTT may be set to the termination voltage level. Thereafter, the first interface circuit 301 may transmit the data DQ<0:7> in synchronization with the data strobe signals DQS and DQSB. Since the termination node VTT is set to the termination voltage level, even when data of a logic high level or a logic low level are consecutively transmitted, the voltage level of the termination node VTT may not be substantially changed. Also, in the case of a system which employs the transmission of balanced codes for termination voltage setting, the voltage level of the termination node VTT may be retained without a substantial variation.

While the write operation is illustrated in FIG. 4, the system 2 may operate in the same way even when performing a read operation. In the read operation, the memory device 220 may transmit data and data strobe signals to the memory controller 210. Therefore, the data transmission units of the memory device 220 may drive the data transmission lines to the termination voltage level during a period in which the preambles of the data strobe signals are transmitted, and the termination node of the memory controller 210 may be set to the termination voltage level. While the specified operation period is illustrated as a period in which the preambles of the data strobe signals are transmitted, it is to be noted that the embodiment is not limited thereto. The specified operation period may be any operation period during which the system 2 does not transmit data through the data transmission lines.

Figure 5:
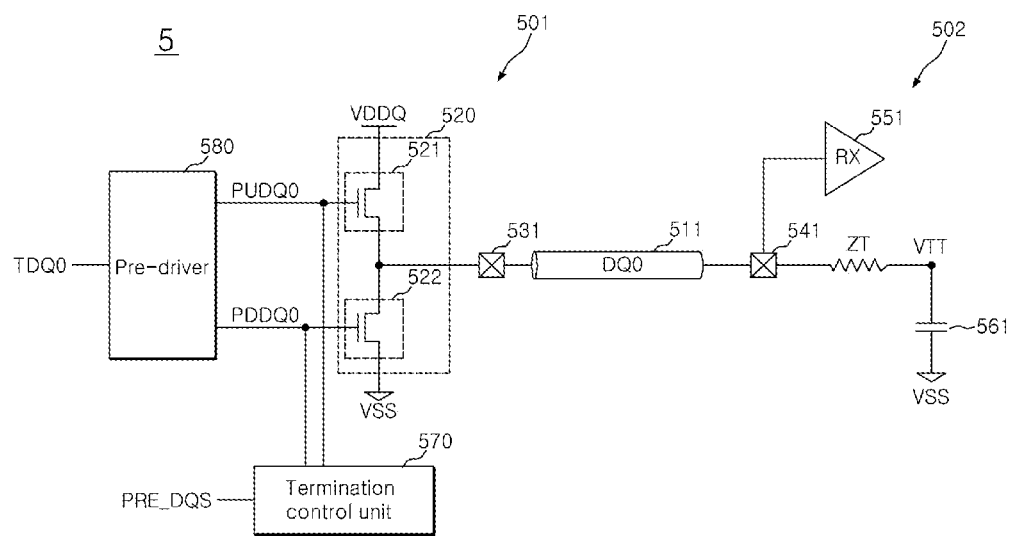
FIG. 5 is a diagram illustrating an example configuration of a system in accordance with an embodiment.

FIG. 5 is a diagram illustrating an example configuration of a system 5 in accordance with an embodiment. A third interface circuit 501 may be an interface circuit of a memory controller, and a fourth interface circuit 502 may be an interface circuit of a memory device. The third interface circuit 501 may be coupled to the fourth interface circuit 502 through a data transmission line 511. The data transmission line 511 may be coupled to the third interface circuit 501 through a data transmission pad 531, and may be coupled to the fourth interface circuit 502 through a data reception pad 541. The third interface circuit 501 may include a data transmission unit 520 and a termination control unit 570. The data transmission unit 520 may drive the data transmission line 511 according to the level of data to be transmitted through the data transmission line 511. For example, when the third interface circuit 501 transmits data of a high level, a pull-up signal PUDQ0 may be enabled, and the data transmission unit 520 may drive the data transmission line 511 with a power supply voltage VDDQ and transmit data DQ0 of a high level. When the third interface circuit 501 transmits data of a low level, a pull-down signal PDDQ0 may be enabled, and the data transmission unit 520 may drive the data transmission line 511 with a ground voltage VSS and transmit data DQ0 of a low level. The data transmission unit 520 may include a pull-up driver 521 and a pull-down driver 522. The pull-up driver 521 may drive the data transmission line 511, which is coupled to the data transmission pad 531, with the power supply voltage VDDQ in response to the pull-up signal PUDQ0. The pull-down driver 522 may drive the data transmission line 511, which is coupled to the data transmission pad 531, with the ground voltage VSS in response to the pull-down signal PDDQ0.

The termination control unit 570 may enable the data transmission unit 520 to drive the data transmission line 511 to a termination voltage level during a specified operation period of the system 5. The specified operation period may be a period in which the preambles of data strobe signals are transmitted. The termination control unit 570 may enable the pull-up signal PUDQ0 and the pull-down signal PDDQ0 in response to a preamble control signal PRE_DQS. The preamble control signal PRE_DQS may be a signal internally generated in response to a command signal to generate the preamble of the data strobe signal. For instance, the level of a termination voltage may be a middle level between the power supply voltage VDDQ and the ground voltage VSS, and, in the case where both the pull-up driver 521 and the pull-down driver 522 are turned on, the data transmission line 511 may be driven to the terminal voltage level.

The third interface circuit 501 may further include a pre-driver 580. The pre-driver 580 may selectively enable the pull-up signal PUDQ0 and the pull-down signal PDDQ0 according to data TDQ0 to transmit. For example, the pre-driver 580 may enable the pull-up signal PUDQ0 in the case where the data TDQ0 to transmit is a high level, and may enable the pull-down signal PDDQ0 in the case where the data TDQ0 to transmit is a low level.

The fourth interface circuit 502 may include a termination resistor ZT and a data reception unit 551. The termination resistor ZT may be coupled between the data reception pad 541 and a termination node VTT. The data reception unit 551 may be coupled to the data transmission line 511 through the data reception pad 541, and may receive the data DQ0 transmitted through the data transmission line 511. The data reception unit 551 may be disabled while the preamble of the data strobe signal is transmitted, and may be enabled and receive the data DQ0 transmitted through the data transmission line 511 when the transmission of the preamble is ended. The fourth interface circuit 502 may further include a capacitor element 561. The capacitor element 561 may be coupled to the termination node VTT, and stabilize the voltage level of the termination node VTT. In the system 5, while the preamble of the data strobe signal is transmitted, the third interface circuit 501 may easily set the termination node VTT to the termination voltage level by driving the data transmission line 511 to the termination voltage level. Accordingly, impedance matching between components forming the system 5 may be easily achieved.

While various embodiments have been described above, it will be understood to those skilled in the art that the embodiments described are examples only. Accordingly, the interface circuit for high speed communication and the system including the same described herein should not be limited based on the described embodiments.

What is claimed is:
1. A system comprising:
   a data transmission unit configured to drive a data transmission line based on data, the data transmission unit, during a period in which a preamble of a data strobe signal is transmitted, driving the data transmission line to a voltage level corresponding to a termination voltage;
   a termination resistor coupled between the data transmission line and a termination node; and
   a data reception unit configured to receive a signal transmitted through the data transmission line.
2. The system according to claim 1, wherein a turn-on impedance value of the data transmission unit is the same as an impedance value of the termination resistor.
3. The system according to claim 1, further comprising:
   a data strobe transmission unit configured to drive a data strobe signal transmission line based on the data strobe signal; and
   a data strobe reception unit configured to receive a signal transmitted through the data strobe signal transmission line.
4. The system according to claim 1, wherein the termination voltage level is a middle level between a power supply voltage of the system and a ground voltage.
5. The system according to claim 1, further comprising:
   a capacitor element coupled between the termination node and the ground voltage.

* * * * *